US006960283B2

(12) United States Patent
Lee et al.

(10) Patent No.: US 6,960,283 B2
(45) Date of Patent: Nov. 1, 2005

(54) ANODE AND MAGNETRON THEREWITH

(75) Inventors: Yong Soo Lee, Shihung-shi (KR); Jong Soo Lee, Anyang-shi (KR)

(73) Assignee: LG Electronics Inc., Seoul (KR)

( * ) Notice: Subject to any disclaimer, the term of this patent is extended or adjusted under 35 U.S.C. 154(b) by 163 days.

(21) Appl. No.: 10/601,550

(22) Filed: Jun. 24, 2003

(65) Prior Publication Data

US 2004/0140207 A1 Jul. 22, 2004

(30) Foreign Application Priority Data

Jan. 16, 2003 (KR) ................................ 10-2003-0002984

(51) Int. Cl.[7] ........................... C23C 14/34; H01J 25/50

(52) U.S. Cl. ............................ 204/298.14; 204/298.16; 315/39.51; 315/39.53; 315/39.71; 315/39.75

(58) Field of Search ....................... 204/298.14, 298.16; 315/39.51, 39.53, 39.71, 39.75

(56) References Cited

U.S. PATENT DOCUMENTS 5,049,782 A * 9/1991 Aiga et al. ............... 315/39.51
5,635,797 A 6/1997 Kitakaze et al. ......... 315/39.51
5,767,749 A * 6/1998 Shon et al. ................... 331/86

FOREIGN PATENT DOCUMENTS

JP 55-33793 3/1980 .......... H01J/23/213
JP 56-149750 11/1981 ............ H01J/23/22

OTHER PUBLICATIONS

English language Abstract of JP 56–149750.
English language Abstract of JP 55–33793.

* cited by examiner

*Primary Examiner*—Steven Versteeg
(74) *Attorney, Agent, or Firm*—Greenblum & Bernstein, P.L.C.

(57) ABSTRACT

Anode with a 2450 MHz resonance frequency, and magnetron therewith, the anode including a cylindrical anode body with an inside diameter in a range of 32.5 to 34.0 mm, a total of ten vanes fitted to an inside circumferential surface of the anode body in a radial direction, and an inner strap and an outer strap provided to both of an upper surface and a lower surface of each vane, a distance of the inner strap and the outer strap being in a range of 0.8 to 1.2 mm, and each of the inner strap and outer strap being in contact with every second vanes for electrical connection of the vanes alternately. The anode body and the vanes are formed as one unit for simplification of a fabrication process.

6 Claims, 6 Drawing Sheets

ANODE AND MAGNETRON THEREWITH

This application claims the benefit of the Korean Application No. P2003-0002984 filed on Jan. 16, 2003, which is hereby incorporated by reference.

BACKGROUND OF THE INVENTION

1. Field of the Invention

The present invention relates to a small sized anode, and a magnetron therewith.

2. Background of the Related Art

In general, the magnetrons, as a kind of vacuum tube, have applications to micro-ovens, plasma lighting apparatuses, dryers, and other high frequency systems owing to merits of simple structure, high efficiency, and stable operation, and the like.

Upon application of a power to the magnetron, thermal electrons are emitted from a cathode, and the thermal electrons generate microwaves by action of a strong electric field, and a strong magnetic field applied between the cathode and an anode. The microwave generated thus is transmitted from an antenna, and used as heat source for heating an object.

A system of the magnetron will be described briefly, with reference to FIG. 1.

Referring to FIG. 1, there are an anode 10 inside of the magnetron, and a cathode 15 of a helical filament 14 in an inner central part of the anode 10.

The anode 10 is provided with a cylindrical anode body 11, a plurality of vanes 12 attached to an inside wall of the anode body 11 in a radial direction, and straps 13 on upper and lower surfaces of the vanes 12.

In the straps 13, there are inner straps 13*a* and outer straps 13*b* each in contact with every second vanes 12 alternately for electrical connection of the vanes 12. The antenna 16 is attached to one of the vanes 12 for emitting a high frequency energy transmitted to the anode 10 to an exterior.

Along with this, there are a resonance cavity between adjacent vanes 12, and an interaction space between the cathode 15 and the vane 12. There are upper and lower magnetic poles 20*a* and 20*b* for being magnetized by magnets 19*a* and 19*b* to generate a magnetic energy.

There are a plurality of cooling fins 17 on an outer circumferential surface of an anode body 11 for dissipating heat from the anode body 11 to an exterior, and upper and lower yokes 18*a* and 18*b* at an outside of the cooling fins 17 for holding and protecting the cooling fins 17 and guiding an external air to the cooling fins 17.

Of the different components of the related art magnetron, the anode 10 will be described in more detail.

Referring to FIGS. 2A and 2B, the cylindrical anode body 11 with an inside diameter Dbi has the plurality of vanes 12 each with a thickness Vt and a height Vh attached thereto in the radial direction. Opposite fore ends of the vanes 12 are spaced a distance Da apart from each other. The inner straps 13*a* and the outer straps 13*b* are provided to the upper part and the lower part of the vanes 12, each with a thickness St and a distance Siso between the two straps 13*a* and 13*b*.

The related art magnetron is operative as follows.

When a power is provided to the cathode 15, thermal electrons are emitted from the filament 14 and positioned in the interaction space. Along with this, the magnetic field formed by one pair of the magnets 19*a* and 19*b* is focused to the interaction space by one pair of the magnetic poles 20*a* and 20*b*.

Consequently, the thermal electrons are caused to make a cycloidal motion by the magnetic field, which generates a microwave having a high frequency energy. The microwave is transmitted from an antenna 16 attached to the vane 12.

The microwave transmitted thus cooks or heats food when the magnetron is applied to a microwave oven, or emits a light as the microwave excites plasma when the magnetron is applied to lighting.

Meanwhile, the high frequency energy failed in the transmission to an outside of the anode 10 is dissipated as heat to an exterior by the cooling fins 17 around the anode body 11.

The related art magnetron is failed in an optimal design, with waste of material. That is, even though cost of the magnetron can be reduced substantially if the oxygen-free copper used in the anode of the related art magnetron is reduced while maintaining performance of the magnetron, there are no researches for this.

Particularly, the part of the related art magnetron that has the highest possibility of a product cost reduction is the anode, because the anode has the greatest expected effect of the cost reduction in that, if a cylindrical inside diameter Dbi of the anode is reduced even a little, a reduction of size is a multiple of $\pi$ (3.14) to the reduced size.

At the end, a necessity of a technology that can reduce the inside diameter Dbi of the anode while maintaining a performance of the magnetron is known.

SUMMARY OF THE INVENTION

Accordingly, the present invention is directed to a small sized anode, and a magnetron therewith that substantially obviates one or more of the problems due to limitations and disadvantages of the related art.

An object of the present invention is to provide a small sized anode, and a magnetron therewith, in which an inside diameter of the anode is reduced for saving a material cost and simplifying a fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the anode with a 2450 MHz resonance frequency includes a cylindrical anode body with an inside diameter in a range of 32.5 to 34.0 mm, a total of ten vanes fitted to an inside circumferential surface of the anode body in a radial direction, and an inner strap and an outer strap provided to both of an upper surface and a lower surface of each vanes, a distance of the inner strap and the outer strap being in a range of 0.8 to 1.2 mm, and each of the inner strap and the outer strap being in contact with every second vanes for electrical connection of the vanes alternately.

The anode body and vanes are formed to have the same thickness, or as one unit for simplification of a fabrication process.

In another aspect of the present invention, there is provided a magnetron with an energy efficiency of higher than 70% including an anode with a 2450 MHz resonance frequency including a cylindrical anode body with an inside diameter in a range of 32.5 to 34.0 mm, a total of ten vanes fitted to an inside circumferential surface of the anode body in a radial direction, and an inner strap and an outer strap provided to both of an upper surface and a lower surface of the vanes, a distance of the inner strap and the outer strap being in a range of 0.8 to 1.2 mm, and each of the inner strap and the outer strap being in contact with every second vanes for electrical connection of the vanes alternately, an antenna attached to one of the vanes for transmitting a high frequency energy generated at the anode body to an exterior, and a helical filament in an inner central part of the anode.

The anode body and vanes are formed to have the same thickness, or as one unit for simplification of a fabrication process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
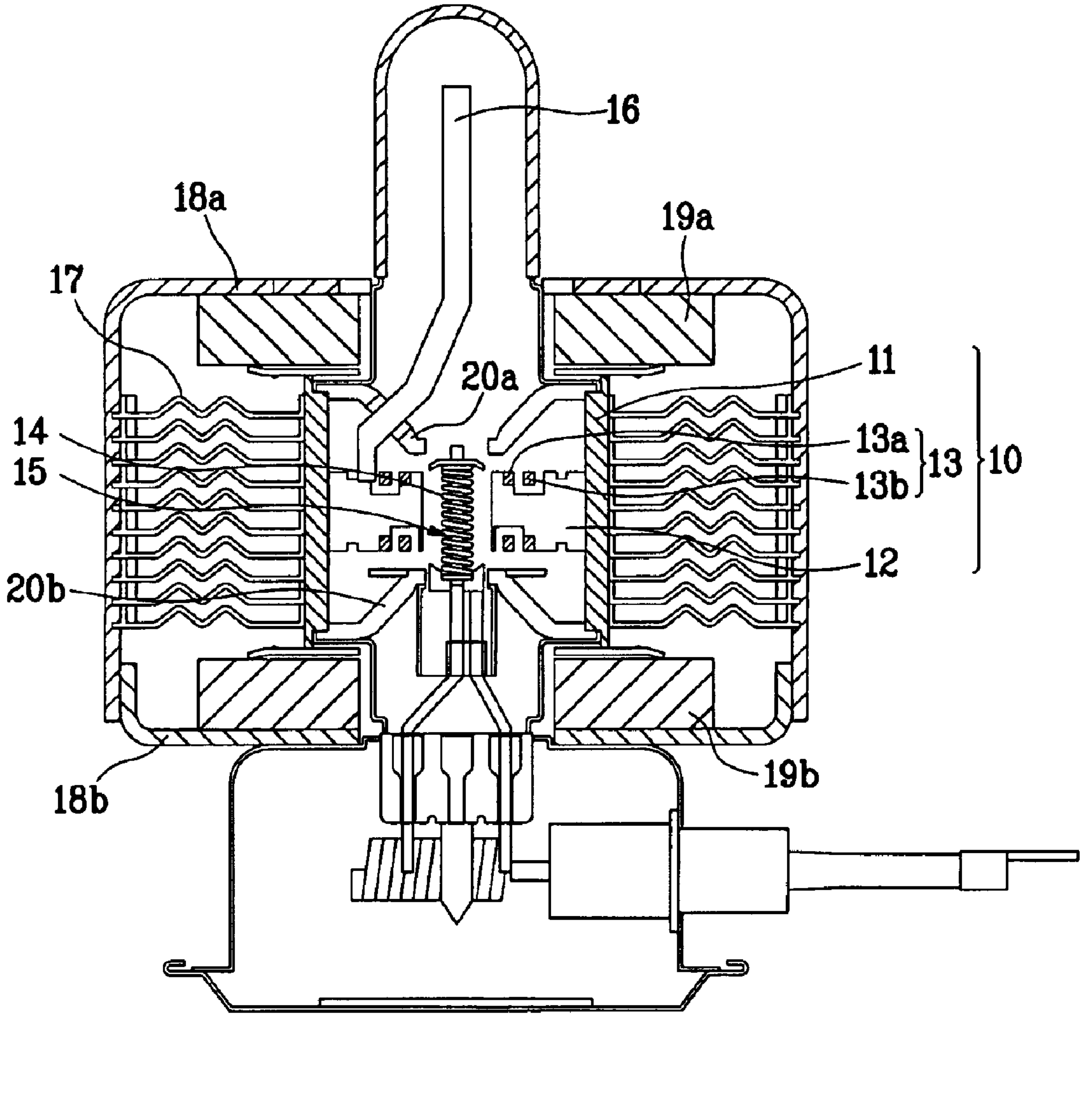
FIG. 1 illustrates a section of a related art magnetron, schematically.
Figure 2A:
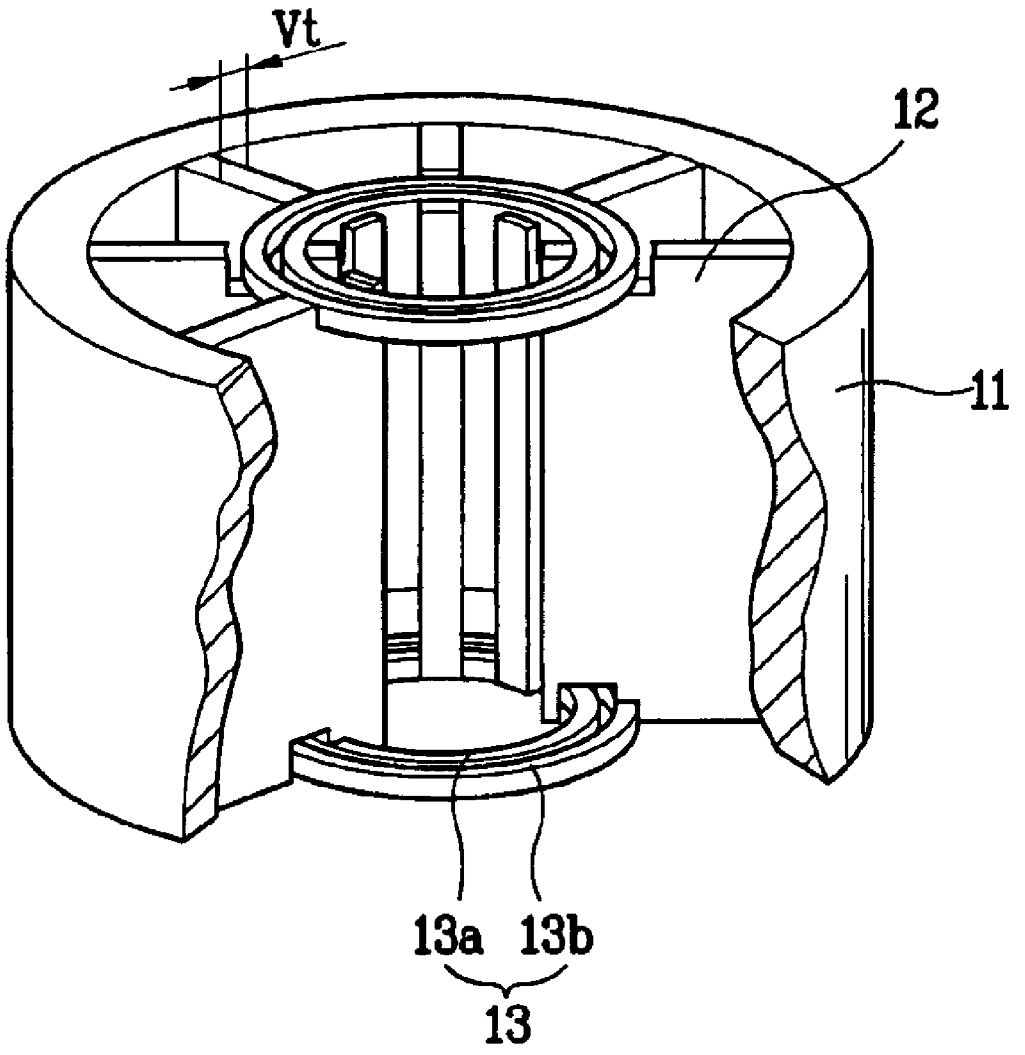
FIG. 2A illustrates a perspective view of a related art anode.
Figure 2B:
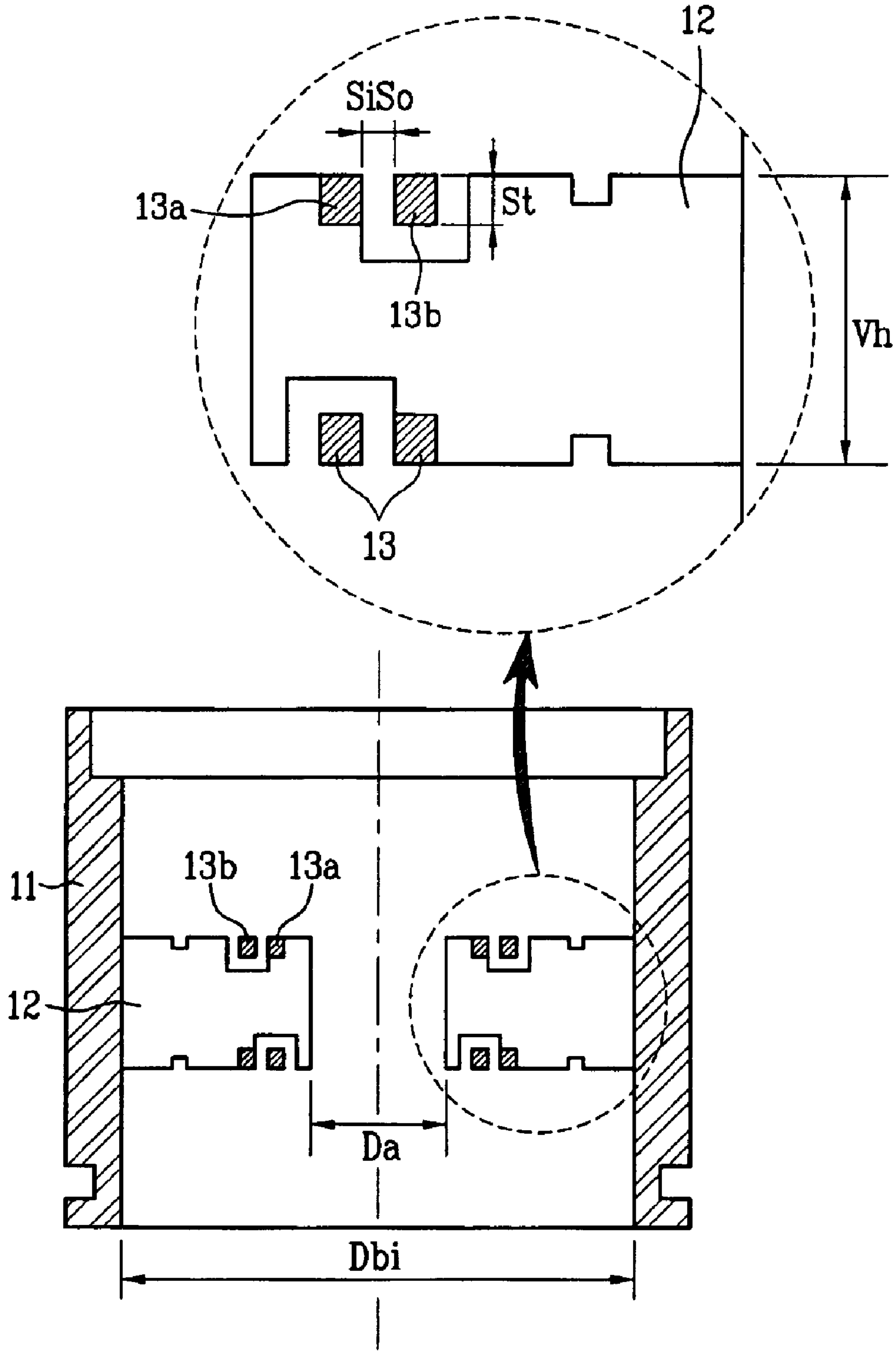
FIG. 2B illustrates a section of a related art anode.

Reference will now be made in detail to the preferred embodiments of the present invention, examples of which are illustrated in the accompanying drawings. In describing embodiments of the present invention, the same parts will be given the same names and reference symbols, and repetitive description of which will be omitted.

The magnetron of the present invention has an anode body 11 of which inside diameter Dbi has a value between a lowest value of 32.5 mm at which characteristics of the magnetron (the resonance frequency, thermal characteristics, and the like) can be maintained, and a highest value of 34.0 mm which meets the purpose of fabricating a small sized magnetron. Also, the magnetron of the present invention has more than 10 vanes, and an energy efficiency higher than 70%, and a 2450 MHz anode 10 resonance frequency.

The anode 10 used in the experiment has 35.5 mm inside diameter Dbi, and 10 vanes 12. The distance Da between the vanes 12 is in the range of 8.9 to 9.2 mm, the height Vh of the vane 12 is in the range of 7.5 to 10.0 mm, and the thickness Vt of the vane 12 is in the range of 1.7 to 2.0 mm. The distance Siso between the inner and outer straps 13*a* and 13*b* is 1.0 mm, and the thickness St of the strap is 1.3 mm.

The experiment is progressed in three stages, which are represent as first, second, and third experiments.

In the first experiment, only the inside diameter Dbi of the anode body 11 is reduced to the range of 32.5 to 34.0 mm while other parameters are kept the same.

Figure 3:
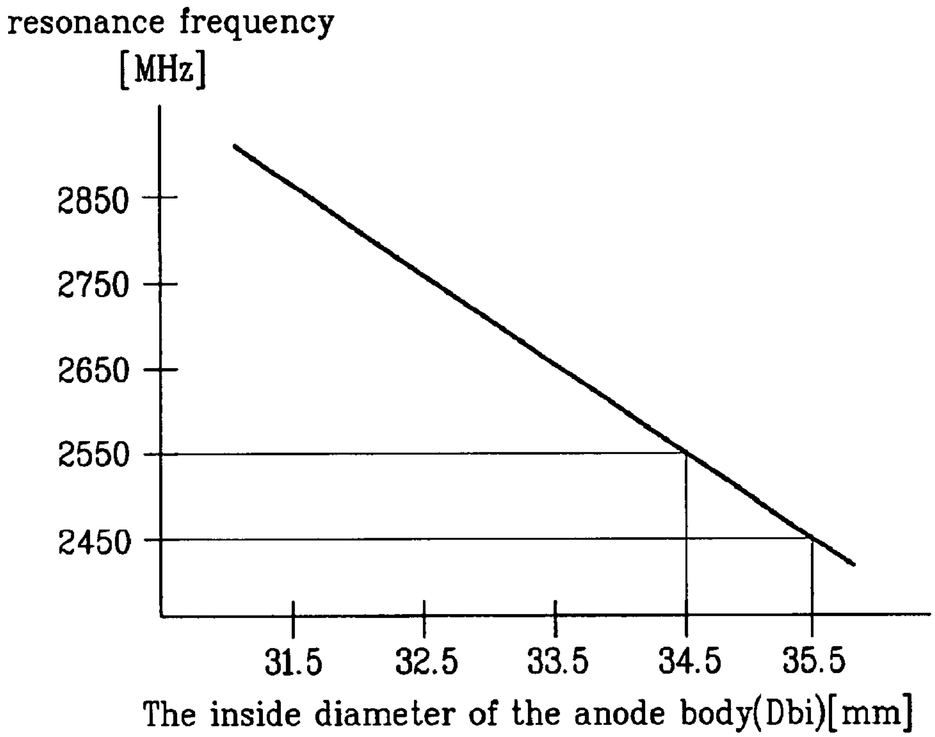
FIG. 3 illustrates a graph showing an inside diameter of an anode vs. a resonance frequency in accordance with a first experiment of the present invention.

As a result, a graph as shown in FIG. 3 is obtained. That is, if the inside diameter Dbi of the anode body 11 is reduced by 0.5 mm, the resonance frequency is increased by 50 MHz.

The reason is as follows.

In the magnetron, the anode 10 is designed to serve as resonator. That is, an inductance is formed between a side surface of the vane 12 of the anode 10 and the an inside wall of the anode body 11, and a capacitance is formed between adjacent vanes 12, the strap 12 and the vane 12, and the inner and outer straps 13*a* and 13*b*, such that the anode 10 forms a parallel LC resonant structure.

Accordingly, as shown in an equation (1) below a frequency of the LC resonant circuit can be obtained therefrom, the capacitance and the resonance frequency are inversely proportional, such that the reduction of the inside diameter Dbi of the anode body 11, which in turn reduces a resonance cavity formed in a space between adjacent vanes 12, also causes a reduction of the capacitance, which increases the resonance frequency, at the end.

$$f = \frac{1}{2\pi\sqrt{LC}} \tag{1}$$

[where, f denotes a resonance frequency, L denotes an inductance, and C denotes a capacitance].

At the end, as illustrated in FIG. 3, within a desired range of 32.5 to 34.0 mm of the inside diameter Dbi of the anode body 11, a desired resonance frequency 2450 MHz is not available.

Next, for solving the problem of the first experiment, the second experiment is carried out, in which both the inside diameter Dbi of the anode body 11 and the strap distance Siso are varied.

Figure 4A:
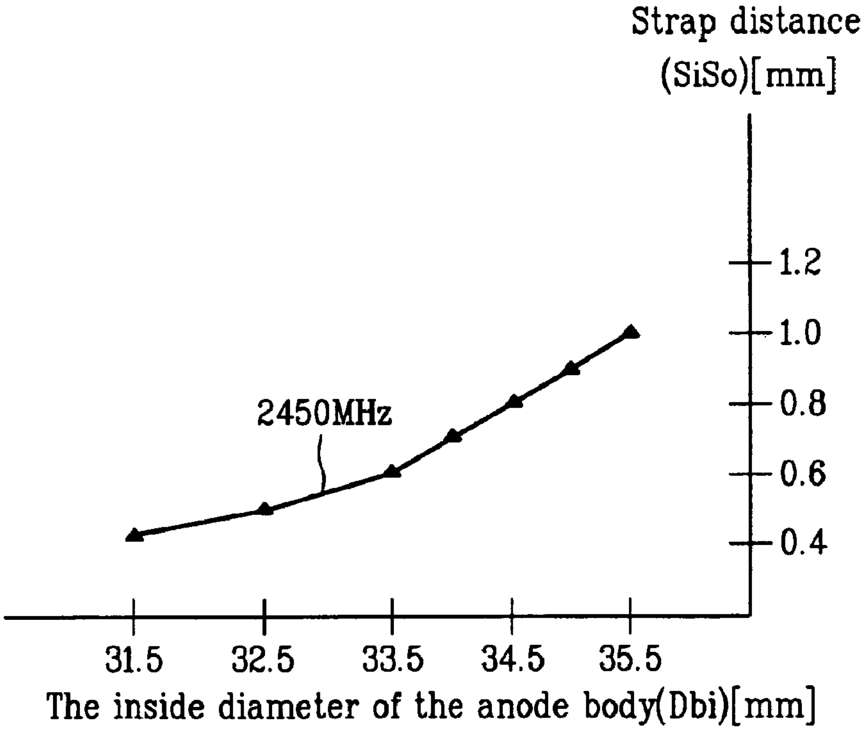
FIG. 4A illustrates a graph showing an inside diameter of an anode vs. a strap distance for maintaining a 2450 MHz resonance frequency in accordance with a second experiment of the present invention.

As a result, as illustrated in FIG. 4A, it is found that there is a relation between the inside diameter Dbi of the anode and the strap distance Siso, which can maintain a 2450 MHz resonance.

That is, the desired resonance frequency of 2450 MHz can be obtained at a desired dimension of the inside diameter Dbi of the anode body 11.

The reason is as follows.

As shown in an equation (2) below, when a potential is applied between two insulated plate conductors, a capacitance 'C' becomes the greater as a distance 'd' between the two plates is the smaller, which implies that if the strap distance Siso between the inner and outer straps 13*a* and 13*b*, which is equivalent to the two conductor plates, is made the smaller, the capacitance between the two straps 13*a* and 13*b* becomes the greater.

$$C = \varepsilon_0 \frac{S}{d} \tag{2}$$

[where, $\epsilon_0$ denotes a dielectric constant, S denotes an area of opposite plates, and 'd' denotes a distance between the plates].

Consequently, the capacitance which becomes the smaller as the inside diameter Dbi of the anode body 11 becomes the smaller is compensated with a reduction of the strap distance Siso which is equivalent to 'd' in the equation (2).

That is, it can be known that if the strap distance Siso is reduced appropriately at the same time with reduction of the inside diameter Dbi of the anode body 11, the same capacitance can be maintained, leading to obtain the 2450 MHz resonance frequency.

Figure 4B:
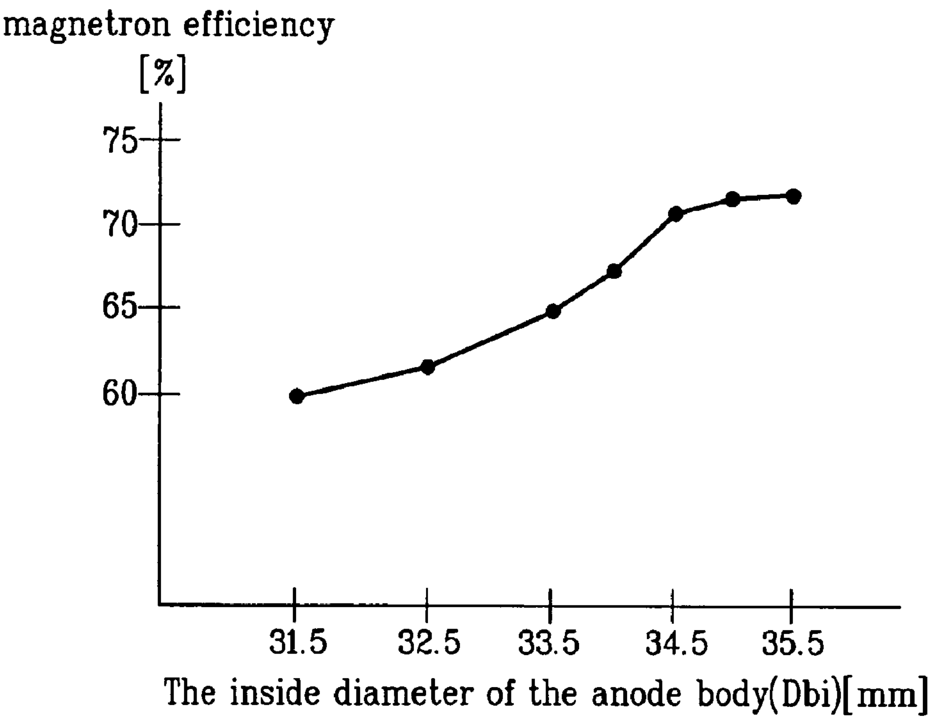
FIG. 4B illustrates a graph showing an inside diameter of an anode vs. an efficiency of a magnetron in a state a 2450 MHz resonance frequency is maintained the same with FIG. 4A.

In the meantime, even though both desired resonance frequency and reduction of the inside diameter Dbi of the anode body 11 are obtained, as shown in FIG. 4B, it can be known that a magnetron efficiency, an energy efficiency of the magnetron, drops sharply starting from 34.5 mm inside diameter Dbi of the anode.

At the end, even though material cost of the anode 10 and a desired resonance frequency can be obtained by reducing the inside diameter Dbi of the anode body 11 and the strap distance Siso, a problem of sharp drop of the magnetron efficiency is caused.

This is caused by a sharp drop of a quality factor Qu of the anode 10 as expressed in the following equation (3), which will be described in association with the equation (3).

The equation (3) represents an unloaded quality factor Qu of a whole anode having the straps 13 fitted to the upper and lower part of the vanes 12 respectively.

$$\frac{1}{Q_u} = \frac{1}{Q_r}\sqrt{\frac{C_r}{C_t}} + \frac{1}{Q_s} \times \frac{C_s}{C_t} \tag{3}$$

$$Ct = Cr + Cs$$

$$Qr = k \times (V/S),\ Qs = k \times Siso$$

$$Q_u = 2\pi f_0 \times \frac{\text{an accumulated energy at an anode}}{\text{dissipated energy from a resonator in one second}}$$

[Where, V denotes a volume of a resonant cavity between adjacent vanes 12, and S denotes a surface of a resonating part. Cr denotes a capacitance of an anode excluding the straps 13, i.e., a capacitance between vanes 12, Cs denotes a capacitance by the inner straps 13*a* and the outer straps 13*b*, and Ct denotes a capacitance of entire anode 10. Qu denotes an unloaded quality factor of entire anode, Qr denotes the unloaded quality factor of the anode 10 without the straps 13, and Qs denotes the unloaded quality factor of the inner straps 13*a* and the outer straps 13*b*. k denotes a coefficient, and Siso denotes a distance between the inner strap and the outer strap].

Referring to the equation (3), it can be noted that if the inside diameter Dbi of the anode body 11 is reduced, which in turn reduces the volume 'V' of the anode 10, Qr is reduced, too. Also, as noted in the experiment 1, if the inside diameter Dbi of the anode body 11 is reduced, the resonance cavity between adjacent vanes 12 is also reduced, which reduces the Cr value, too.

On the other hand, since it is required that Ct is kept constant for maintaining the resonance frequency 2450 MHz of the anode 10, a greater Cs value is required for compensating for a reduced Cr value. Therefore, if the strap distance Siso is reduced the same as the experiment 2 for the greater Cs value, Qs value is reduced, at the end.

Eventually, as both the inside diameter Dbi of the anode body 11 and the strap distance Siso are reduced, both the Qr value and the Qs value are reduced, to reduced the Qu value sharply. Referring to FIG. 3, the reduced Qu value implies greater energy dissipation from the resonator, and drop of energy efficiency.

After all, taking the object of the present invention being reduction of the inside diameter Dbi of the anode body 11 into account, what is required for enhancing the energy efficiency is an increase of Qu value, which implies an increased Qs value, i.e., the strap distance Siso.

However, the increased strap distance Siso returns to the same result with the experiment 1, failing in obtaining the desired resonance frequency at the inside diameter Dbi of the reduced anode body 11.

For solving these problem, the third experiment is carried out, in which both the strap distance and the strap thickness St are varied together with the inside diameter Dbi of the anode body 11.

The strap thickness St is varied because the capacitance varies with the strap thickness St. That is, the greater the strap thickness St, the greater an area of opposite straps 13, which in turn makes the capacitance the greater as expressed in the equation (2), which implies that the reduction of capacitance caused by reduction of the inside diameter Dbi of the anode body 11 is compensated, not with a change of the strap distance Siso, but with the strap thickness St, for obtaining the desired resonance frequency.

Thus, as the strap distance Siso can be increased along with the Qs value in the equation (3) by adjusting the strap thickness St appropriately, which increases the Qu value at the end, the energy efficiency can be improved.

Of course, even though, in a point of view, the increase of strap thickness St is not consistent with the objects of the present invention of fabricating a smaller anode 10 and reduce a material cost, the reduction of the inside diameter Dbi of the anode body permits to achieve the objects of the present invention, adequately.

Taking above problems into account, in the third experiment, the inside diameter Dbi of the anode body 11 is reduced, and, at the same time with this, the strap distance Siso and the strap thickness St are varied appropriately while the resonance frequency of the anode 10 is kept to be 2450 MHz, and under which condition, the efficiencies of the magnetron are compared.

As a result, referring to FIG. 5, it is noted that the magnetron efficiency drops sharply starting from 0.8 mm and below of the strap distance Siso regardless of an inside diameter Dbi variation of the anode body 11, and varies moderately at values greater than 0.8 mm.

It is also noted that the magnetron efficiency is below 70% starting from 32.5 mm and below of the inside diameter Dbi of the anode body, and above 70% at values greater than 32.5 mm, under a condition a range the strap distance Siso is 0.8 mm and greater.

Figure 5:
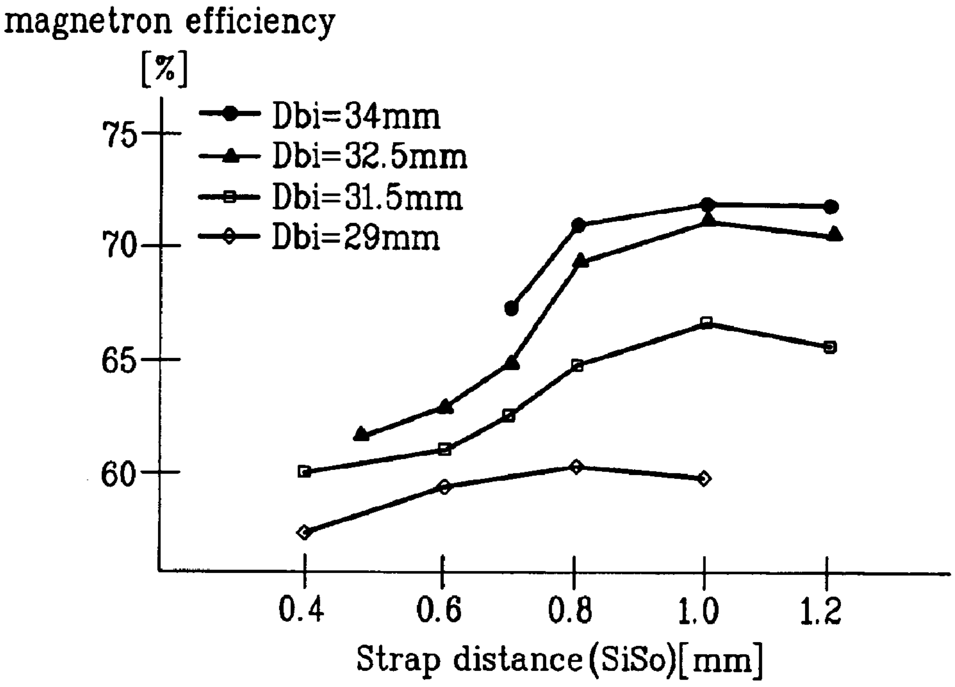
FIG. 5 illustrates a graph showing a strap distance vs. a magnetron efficiency for anodes with different inside diameters of the present invention.

In the meantime, the strap thickness St is omitted from FIG. 5, because the strap thickness St for maintaining the 2450 MHz resonance frequency is naturally fixed according to above equations once the strap distance Siso and the inside diameter Dbi of the anode body 11 are fixed.

A relation between Qu and the magnetron efficiency will be discussed, with reference to the following equation (4) for describing the result of the third experiment in more detail.

$$\frac{1}{Q_L} = \frac{1}{Q_u} + \frac{1}{Q_E} \tag{4}$$

$$Q_L = 2\pi f_0 \times \frac{\text{accumulated energy at an anode}}{\text{total energy dissipated in one second}}$$

$$Q_u = 2\pi f_0 \frac{\text{accumulated energy at an anode}}{\text{energy dissipated from an anode in one second}}$$

$$Q_E = 2\pi f_0 \frac{\text{accumulated energy at an anode}}{\text{energy dissipated from external loads in one second}}$$

$$\eta_{MGT} = \eta_e * \eta_c = \eta_e \times \left(1 - \frac{Q_L}{Q_u}\right)$$

[Where, Qu denotes an unloaded quality factor of entire anode, QE denotes a quality factor for an external load, a ratio of an accumulated energy at the anode to an energy dissipated from external loads (an antenna fitting position, a waveguide, an object to be heated, and the like) outside of the anode, QL is a quality factor for an entire load, denoting a ratio of an energy accumulated at an anode to a total energy dissipated by an internal resistance and an external resistance in one second. $\eta_{MGT}$ denotes a magnetron efficiency, ηe is an electron efficiency, denoting a ratio of a DC energy provided to an anode to an energy of a microwave from the anode, which is less sensitive to sizes of the anode, to be constant at approx. 80%. $\eta_c$ is a circuit efficiency, denoting a ratio of an output power to a power provided to a load at a required frequency of the magnetron, and varies with a size of the anode, and when $\eta_c$ is kept approx. 90%, the magnetron efficiency is maintained to be approx. 70%.]

Referring to the equation (4), what vary with a size of the anode 10 sensitively are $Q_L$, Qu, and the circuit efficiency $\eta_c$, wherein the $Q_L$ can be fixed at approx. 150~250 by adjusting the $Q_E$, appropriately.

The QE is adjusted by using a method in which a position of the antenna 16 fitted to the vanes 12 is adjusted among different parameters for fixing the external load, through which the $Q_L$ value is adjusted. With reference to FIG. 3, the inside diameter Dbi is adjusted in the range of 32.5 to 34.0 mm, and the strap distance Siso is adjusted in the range of 0.8, to 1.2 mm so that the Qu value is to be greater than 1450.

At the end, since the electron efficiency $\eta_e$ which has no relation with the size of the anode 10 is maintained at 80% according to the related art, and the circuit efficiency $\eta_c$ related to the size of the anode 10 is maintained to be approx. 90%, the magnetron efficiency $\eta_{MGT}$ can be maintained greater than 70% the same with the related art.

Meanwhile, the small sized anode 10 has been review in view of efficiency of the magnetron up to now, and will be reviewed in view of heat of the magnetron.

If the inside diameter Dbi of the anode body 11 is reduced, at the end, an area of heat exchange is also reduced, with a consequential reduction of heat to be transferred to the cooling fins 17, which implies an inadequate cooling down, to deteriorate a thermal characteristic of the magnetron, resulting in the magnetron being out of order.

This is caused as a maximum rated temperature of the anode 10 is exceeded. Particularly, the maximum rated temperature of the anode 10 is approx. 500° C., and when the anode 10 has a temperature exceeding this, it is required that the anode 10 is cooled down. In a case of the small sized anode 10, the reduction of heat exchange area, with reduction of heat transfer, causes deterioration of thermal characteristic.

Figure 6:
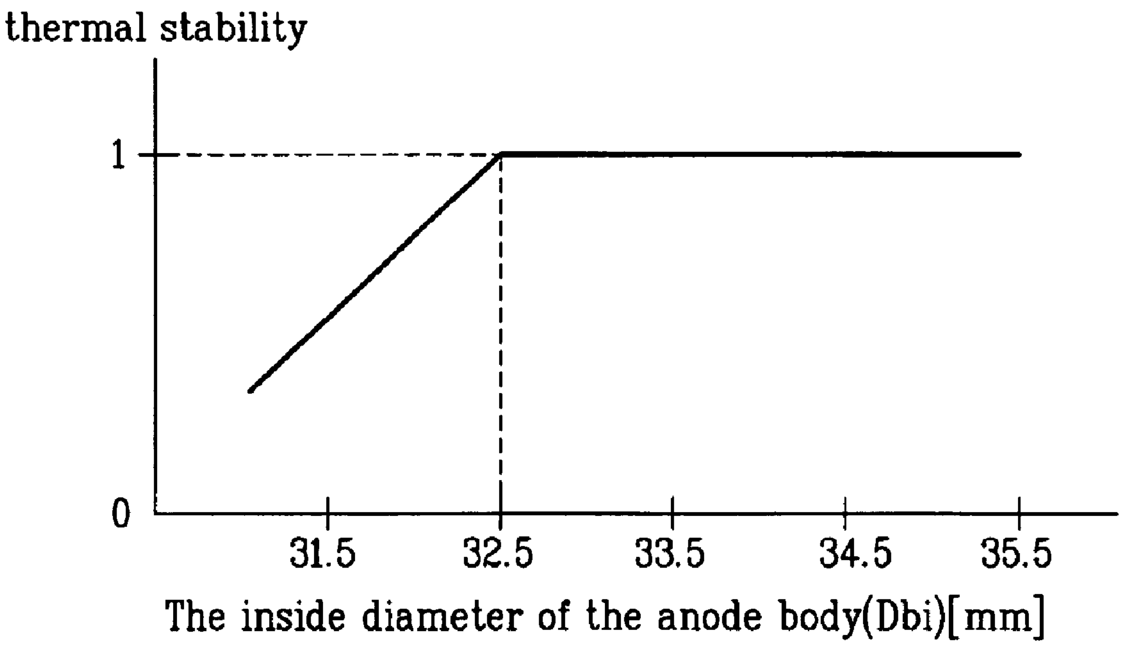
FIG. 6 illustrates a graph showing an inside diameter of an anode body vs. a thermal stability of an anode of the present invention.

However, referring to FIG. 6, as a result of the thermal characteristic experiment, it is verified that the anode 10 of the magnetron of the present invention is stable in view of heat in a case the anode body 11 has a 32.5 mm inside diameter Dbi and over, below which the thermal stability becomes extremely poor. That is, the inside diameter Dbi of the anode body can not be reduced below 32.5 mm.

The magnetron is reviewed in light of efficiency and thermal stability, and simplification of a fabrication process of the anode 10 will be reviewed from now on.

For simplification of the anode fabrication process, it is preferable that the anode body 11 and the vanes 12 are formed as one unit at a time. Particularly, it is more preferable that thicknesses of the anode body 11 and the vanes 12 are designed to be the same, and formed by press, so that a shearing stress is exerted to the anode body 11 and the vanes 11 uniformly, to minimize a defect ratio.

Even if the anode body 11 and the vanes 12 are not formed as one unit, but if the thicknesses of the anode body 11 and the vanes 11 are the same, unnecessary fabrication process can be omitted as separate management of thickness of the anode body 11 and the vanes 12 are not required like the related art.

Eventually, owing to size reduction of the entire magnetron, the magnetron of the present invention can reduce a product cost by more than approx. 21% than the related art magnetron while performance of the related art magnetron is maintained, which is a significant reduction of cost and enhances a product competitiveness.

The smaller anode permits effective space utilization as a space occupied by the anode in the magnetron is reduced.

As has been explained, the small sized anode, and the magnetron therewith of the present invention have the following advantages.

First, the smaller anode without change of a magnetron performance permits an effective space utilization and reduction of a material cost of the expensive anode by approx. 21% in comparison to the related art.

Second, the fabrication process is simplified as the anode body and the vanes are designed to have the same thicknesses.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An anode with a 2450 MHz resonance frequency comprising:

a cylindrical anode body with an inside diameter in a range of 32.5 to 34.0 mm;

a plurality of vanes fitted to an inside circumferential surface of the anode body in a radial direction, the plurality comprising at least ten; and inner straps and outer straps positioned at opposite sides of the vanes, a distance between the inner strap and the outer strap being in a range of 0.8 to 1.2 mm, and one of the inner strap and outer strap being in contact with every second vane for alternate electrical connection of the vanes.

2. The anode as claimed in claim 1, wherein the anode body and vanes are formed as a single.

3. The anode as claimed in claim 1, wherein the anode body and vanes have the same thickness.

4. A magnetron with an energy efficiency of higher than 70% comprising:

an anode with a 2450 MHz resonance frequency including;

a cylindrical anode body with an inside diameter ranging 32.5~34.0 mm, a plurality of vanes fitted to an inside circumferential surface of the anode body in a radial direction, the plurality comprising at least ten; and inner straps and outer straps positioned at opposite sides of the vanes, a distance between the inner strap and the outer strap being in a range of 0.8 to 1.2 mm, and one of the inner strap and outer strap being in contact with every second vane for alternate electrical connection of the vanes;

an antenna attached to one of the vanes for transmitting a high frequency energy generated at the anode body to an exterior; and a helical filament in an inner central part of the anode.

5. The magnetron as claimed in claim 4, wherein the anode body and vanes are formed as a single.

6. The magnetron as claimed in claim 4, wherein the anode body and vanes have the same thickness.

* * * * *